United States Patent
McDonough

(10) Patent No.: US 10,778,241 B2
(45) Date of Patent: Sep. 15, 2020

(54) OPTICAL ENCODER SYSTEMS AND METHODS

(71) Applicant: Buffalo Automation Group Inc., Amherst, NY (US)

(72) Inventor: Trevor R. McDonough, Amherst, NY (US)

(73) Assignee: Buffalo Automation Group Inc., Amherst, NY (US)

( * ) Notice: Subject to any disclaimer, the term of this patent is extended or adjusted under 35 U.S.C. 154(b) by 0 days.

(21) Appl. No.: 16/555,314

(22) Filed: Aug. 29, 2019

(65) Prior Publication Data

US 2020/0076443 A1 Mar. 5, 2020

Related U.S. Application Data

(60) Provisional application No. 62/724,053, filed on Aug. 29, 2018.

(51) Int. Cl.
| | | |
|---|---|---|
| *H03M 1/10* | (2006.01) | |
| *H03M 1/30* | (2006.01) | |
| *G01D 5/347* | (2006.01) | |

(52) U.S. Cl.
CPC ...... *H03M 1/1066* (2013.01); *G01D 5/34776* (2013.01); *H03M 1/30* (2013.01)

(58) Field of Classification Search
CPC ... H03M 1/1066; H03M 1/30; G01D 5/34776
USPC .......................................................... 341/13
See application file for complete search history.

(56) References Cited

U.S. PATENT DOCUMENTS

| | | | |
|---|---|---|---|
| 3,968,445 | A | 7/1976 | Sherman |
| 4,077,030 | A | 2/1978 | Helava |
| 4,914,437 | A | 4/1990 | Kibrick et al. |
| 5,019,964 | A | 5/1991 | Yamamoto et al. |
| 8,832,488 | B2 | 9/2014 | Rogers et al. |
| 2002/0130645 | A1 | 9/2002 | Tsai et al. |
| 2015/0081156 | A1 | 3/2015 | Trepagnier et al. |
| 2015/0286340 | A1* | 10/2015 | Send ...................... G01S 5/163 |
| | | | 345/175 |
| 2017/0363465 | A1* | 12/2017 | Send ...................... G01S 17/46 |
| 2017/0363741 | A1* | 12/2017 | Send .................... G01S 7/4816 |

(Continued)

OTHER PUBLICATIONS

WIPO, ISR for PCT/US2019/048875, dated Nov. 14, 2019.

*Primary Examiner* — Lam T Mai
(74) *Attorney, Agent, or Firm* — Hodgson Russ LLP

(57) ABSTRACT

The present disclosure may be embodied as an optical encoder system comprising a first optical sensor, a second optical sensor, a first up-down counter, a second up-down counter, and an I/O expander. The optical encoder system may further include a buffer. The present disclosure may also be embodied as an optical encoder system comprising an optical encoder, and a monostable multivibrator. The present disclosure may also be embodied as a method for encoding optical data comprising generating a first optical sensor signal and a second optical sensor signal, converting the first optical sensor signal and second optical sensor signal into four first counter signals, generating a borrow output signal and a carry output signal, converting the borrow output signal and the carry output signal into four second counter signals, and converting the first counter signals and second counter signals into a serial data signal and a serial clock signal.

20 Claims, 8 Drawing Sheets

(56) References Cited

U.S. PATENT DOCUMENTS

| | | | | |
|---|---|---|---|---|
| 2018/0007343 A1* | 1/2018 | Send | .......................... | G01S 5/16 |
| 2018/0276843 A1* | 9/2018 | Send | .......................... | G01C 3/06 |
| 2019/0353767 A1* | 11/2019 | Eberspach | ............ | G01J 1/4228 |
| 2020/0011995 A1* | 1/2020 | Send | ..................... | G01S 7/4817 |

\* cited by examiner

# OPTICAL ENCODER SYSTEMS AND METHODS

CROSS REFERENCE TO RELATED APPLICATIONS

This application claims priority to U.S. Provisional Application No. 62/724,053 filed on Aug. 29, 2018, the entire disclosure of which is hereby incorporated by reference.

FIELD OF THE DISCLOSURE

The present disclosure generally relates to a system and method for encoding optical data and linear/rotational position tracking.

BACKGROUND OF THE DISCLOSURE

Standard optical encoder systems use two or three optical sensors with a counting mechanism to track a linear or rotational position of a monitored subject. Optical encoders have been employed in autonomous vehicle for rotational and/or linear position of various (driving control units). These systems, however, comprise mostly analog components and the incorporation of traditional encoders require the control/object monitored to be disassembled or completely redesigned to incorporate an encoder. Thus, they are limited as to the locations they can be mounted on, in an environment that is densely populated with control tools and electronics such as the driving control area of an autonomous vehicle. Further, the processing speed of such an analog system is significantly slower compared to a fully digitized system. Therefore, a need exists for improved accuracy and speed of sensing.

An ability to get more information about the rotational and/or linear position of different driving control units from different optical encoders, strategically placed proximal to the driving control units, improves the reliability of the sensing system. The driving control area is typically an environment that is densely populated with control systems and electronics and has limited wiring provisions available. Therefore, a need exists for a network for encoder systems and communications techniques between the network of encoder systems and a processing unit within the limited wiring options.

High-speed, real-time sensing systems that involve counting, a common scenario with optical encoder systems, may sometimes lead to spurious data due to a lag or a noise interference between a sensed change of value and the corresponding count value. In bidirectional counting systems, in situations where the sensed value changes back and forth between two subsequent positions, this lag or noise interference may lead to erroneous unidirectional counting, completely bypassing a reversal in counting direction that must have occurred. This can lead to a dysfunctional system. Therefore, a need exists to ensure timely transition between the counting directions for the successful and reliable operation of the system.

Autonomous vehicles typically have lengthy electrical connection buses connecting sensing systems and processing units that are often separated by a significant physical distance. The Signal to Noise Ratio (SNR) of high-speed digital signals deteriorates with increased wire length due to increased noise interferences and bus capacitances. Therefore, a need exists for translating the high-speed signal into a signal suitable for distant communication.

Therefore, a need exists for a compact, high-speed, digital optical encoder system which can be conveniently mounted and networked with a large number of other such systems, for improved sensing performance, and be held in communication with a processing unit that is separated by a physical distance with a sufficient signal quality.

SUMMARY OF THE DISCLOSURE

An embodiment is an optical encoder system, comprising a reflective surface, a first optical sensor, a second optical sensor, a first up-down counter, a second up-down counter, a parallel to serial communication interface, and a buffer. The first optical sensor may be configured to generate a first output signal. The second optical sensor may be configured to generate a second optical signal. The first up-down counter may be configured to count up or down from a reference value based on the first and second output signals and generate a first counter signal, a borrow output signal, and a carry output signal. The second up-down counter may be configured to count up or down relative to the first counter signals based on the borrow output signal and the carry output signal and generate a second counter signal. The parallel to serial communication interface may be configured to translate a parallel signal, including the first counter signal and the second counter signal, into a serial signal. The buffer may be configured to adapt the serial signal for long distance transmission.

The system may further comprise a monostable multivibrator. The monostable multivibrator may be operatively connected to the first optical sensor and second optical sensors and the first counter. The monostable multivibrator may be configured to modify the first output signal and the second output signal prior to the arrival of the first output signal and the second output signal at the first up-down counter.

The first up-down counter and the second up-down counter may be in a cascaded configuration.

The parallel to serial communication interface may comprise an input/output (I/O) expander configured to convert the parallel output data into the serial signal having at least two voltage levels and a serial clock signal having a frequency.

The I/O expander may comprise an electronic data storage unit operatively connected to the buffer and may be configured to store the serial signal values as a plurality of serial output data values.

The I/O expander may comprise a switchable address pin configured to select one of the plurality of serial output data values.

The serial signal may comprise an inter-integrated circuit ($I^2C$) protocol signal.

Adapting the serial signal may include increasing at least one of the at least two voltage levels of the serial signal and decreasing the frequency of the serial clock signal.

The first and second optical sensors may be reflective optical sensors.

The reflective surface may comprise a codewheel or a codestrip.

The first and second output signals may correspond to a linear or rotational position of a driving control unit in an autonomous vehicle.

Another embodiment is a method for encoding optical data. The method may comprise emitting light on a reflective surface; generating a first output signal; generating a second output signal; counting up or down from a reference value at a first up-down counter to generate a first counter signal, a borrow output signal, and a carry output signal; counting up or down from the first counter signal based on the carry output signal and the borrow output signal to generate a second counter signal; serializing, at a parallel to serial communication interface, the first counter signal and second counter signal into a serial signal; and buffering, at a buffer, the serial signal thereby adapting the serial signal for long distance transmission.

The first output signal may be generated at a first optical sensor. The second output signal may be generated at a second optical sensor. The first and second output signals may be generated at the first and second optical sensors, respectively, and may be based on a reflected light signal from the reflective surface. The reference value may be based on the first output signal and the second output signal.

The method may further comprise modifying the first output signal and the second output signal. The modifying may be done using a monostable multivibrator operatively connected to the first optical sensor, the second optical sensor, and the first up-down counter. The monostable multivibrator may be connected to the first optical sensor, the second optical sensor, and the first up-down counter such that it modifies the first output signal and the second output signal prior to the arrival of the first output signal and the second output signal at the first up-down counter.

Serializing the serial signal may comprise generating at least two voltage levels and a serial clock signal having a frequency. Serializing the serial signal may comprise generating an $I^2C$ signal.

The method may further comprise storing the serial signal as a plurality of serial output data values on an electronic data storage unit, which may be operatively connected to the buffer.

Buffering the serial signal may include increasing at least one of the at least two voltage levels of the serial signal and decreasing the frequency of the serial clock signal.

The first and the second optical sensor signals may correspond to a linear and/or rotational position of a driving control unit in an autonomous vessel.

The method may further comprise regulating a voltage, using a voltage regulator, to provide a plurality of supply voltages to at least one component.

The voltage regulator may comprise one or more of a buck regulator, a boost regulator, a buck-boost regulator, or a programmable power management IC based regulator.

BRIEF DESCRIPTION OF THE FIGURES

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Ranges of values are disclosed herein. The ranges set out a lower limit value and an upper limit value. Unless otherwise stated, the ranges include all values to the magnitude of the smallest value (either lower limit value or upper limit value) and ranges between the values of the stated range.

Figure 1A:
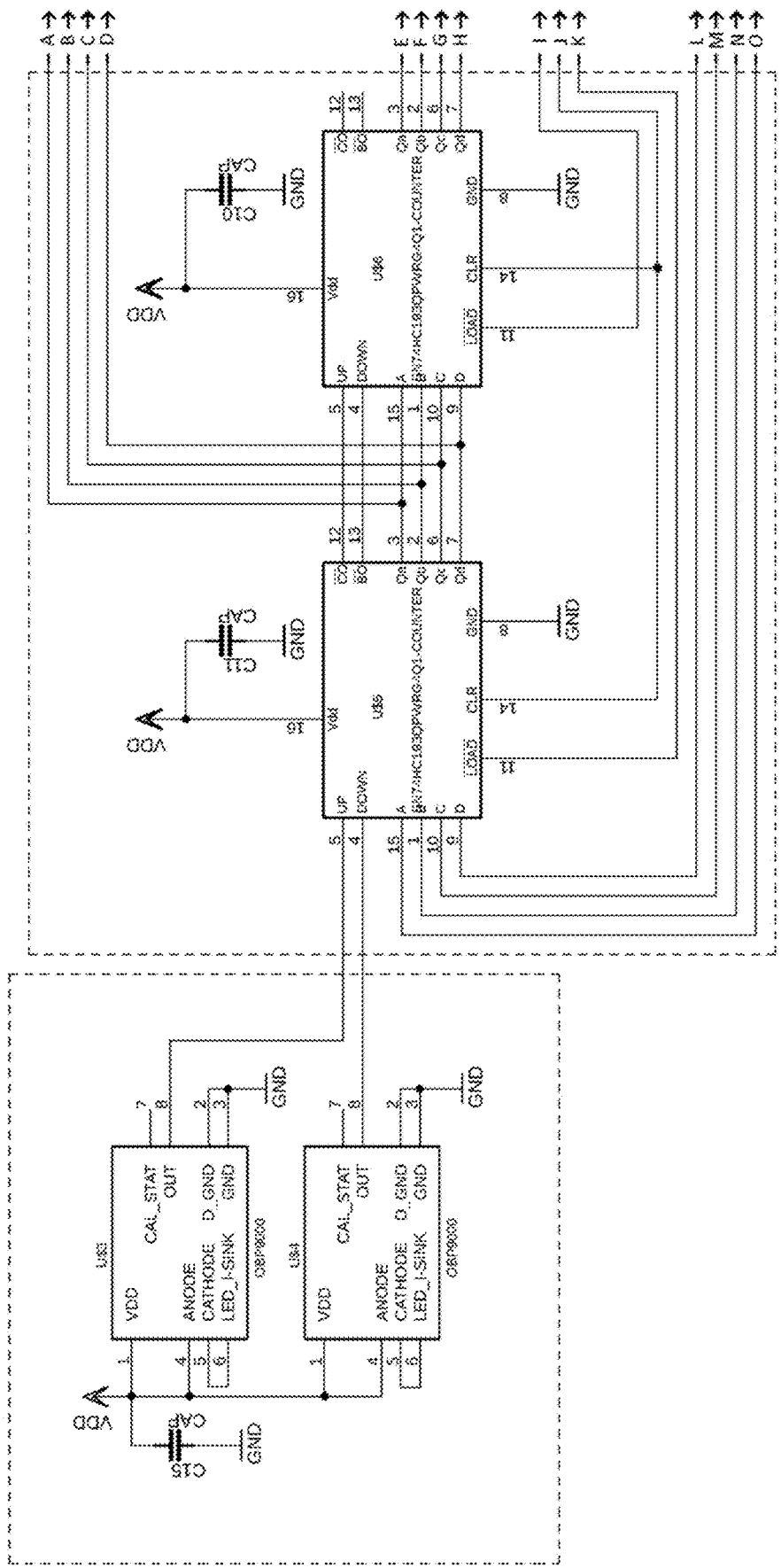
FIG. 1A shows a first portion of a circuit schematic of a first embodiment of the present disclosure.
Figure 1B:
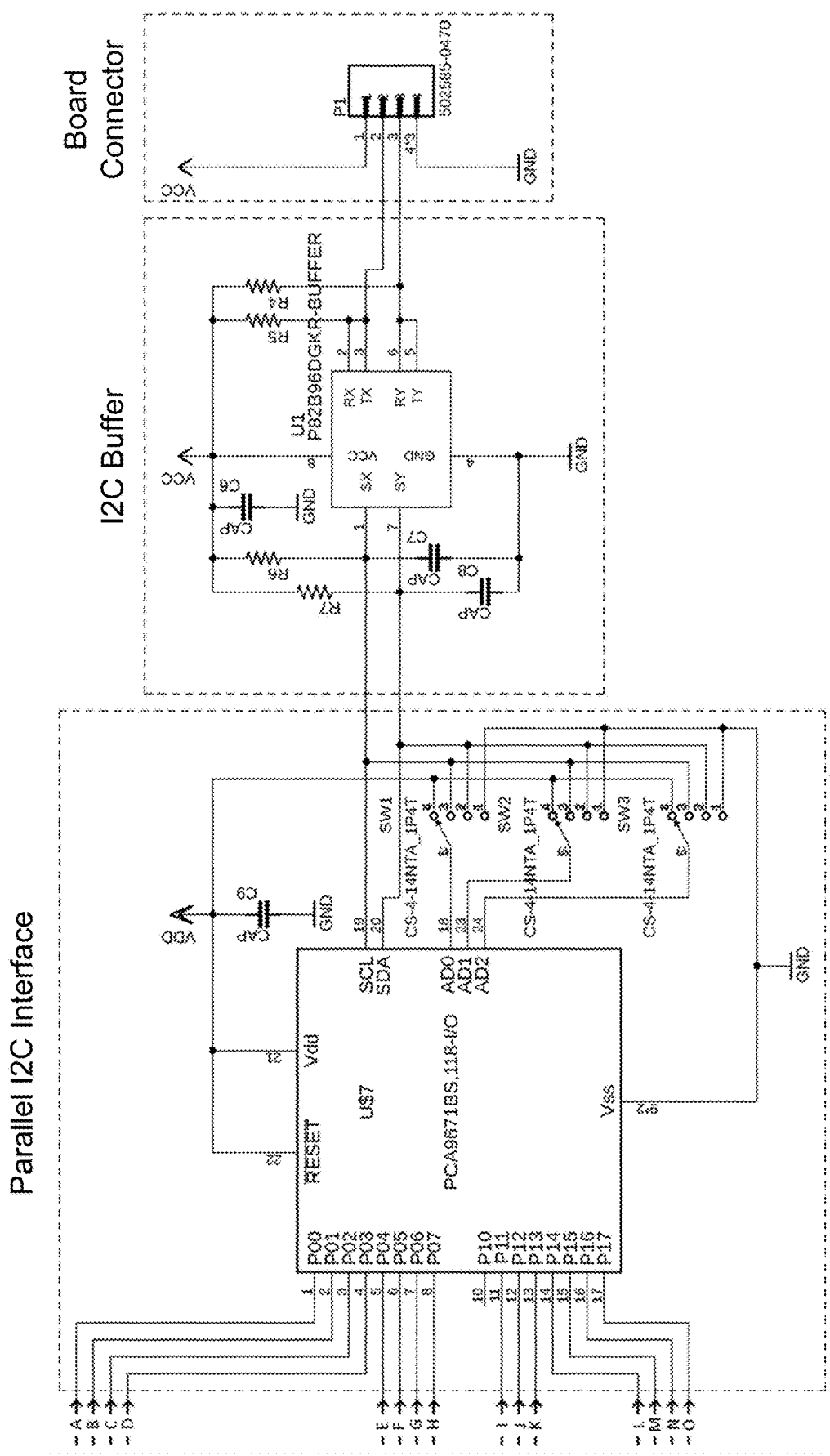
FIG. 1B shows a second portion of a circuit schematic of a first embodiment of the present disclosure.

In a first embodiment of the present disclosure shown, for example, in FIGS. 1A-1B, an optical encoder system is disclosed. FIG. 1A and FIG. 1B represent a single circuit schematic, with breaks A-O. In a non-limiting example, VCC may be 12V and VDD may be 5V. The optical encoder system may be mounted proximal to the driving control unit. The optical encoder system may be employed to detect the linear and/or the rotational position of the driving control units. The optical encoder system may include a reflective surface. The reflective surface may be a codewheel or a codestrip, with alternating reflective and opaque surfaces, deployed on target driving control unit. As a non-limiting example, this driving control unit may be a steering wheel or a steering wheel shaft. A codewheel could be mounted to a rotating face of a control. A codestrip could be mounted to the circumference of such a rotating control and move coaxially, or flat on a linear/sliding control. For instance, on a shaft, a codewheel could be mounted radially while a code strip would be wrapped circumferentially. The optical encoder system can further include two optical sensors comprising two optical emitters configured to direct light at the codestrip or a code wheel and two reflective optical detectors. As a non-limiting example, the optical encoders may be surface mount encoder integrated circuits (ICs), such as model no. OPB9000 manufactured by TT ELECTRONICS as shown in FIG. 1A. A sensor may be selected based on its parameters including a sufficient rejection of light. The reflective optical sensors of the optical encoders may produce pulses that correspond to the detected reflected light.

Autonomous vehicles such as, but not limited to maritime vessels like ships and boats, cars, trucks, or other vehicles may employ embodiments of the present disclosure. A specific embodiment may be optimized for vibrational, temperature, or other environmental requirements of the embodiment.

Referring to FIG. 1A, the optical encoder system may further include a pair of 4-bit synchronous up/down counters. The two 4-bit counters may be connected in a cascaded configuration for increasing the net number of states of the counters. As a non-limiting example, the counters may be model no. SN74HC193 manufactured by TEXAS INSTRUMENTS, or other dual-clock counter, as shown in FIG. 1A. A standard counter has only one clock input. A dual-clock counter has up and down control inputs; one pin may function as an enable pin and a rising edge on the other causes a count. The 4 Q output pins of the first counter may be connected to the four input pins A, B, C and D of the second counter and the carry and borrow outputs of the first counter may be connected to the up and down control inputs of the second counter. A counter first receives a quadrature signal from the encoders and counts up or down according to the phase difference between the up and down signals. As a non-limiting example, if the up signal lags the down signal, the counter may count up denoting a movement of the subject in one of the clockwise/anticlockwise or forward/backward directions. Alternatively, if down signal lags the up signal, the counter may count down denoting a movement of the subject in the opposite direction to the aforementioned direction. The up and down signals may be bi-level pulses following a binary denotation or, in a preferred embodiment, a gray code denotation. Gray code, otherwise known as reflected binary code, is an ordering of the binary numeral system such that two successive values differ in only one bit.

In some embodiments, an n-bit counter and m-bit counter may compose a larger (n+m)-bit counter. For example, a first 4-bit counter and a second 4-bit counter can compose an 8-bit counter. Another embodiment may use model no. SN74AS867 manufactured by TEXAS INSTRUMENTS.

When the first counter overflows, the second counter may continue to count up or down, depending on if the overflow was negative or positive as denoted by the carry and borrow output signals of the first counter, as explained above, which may be fed into the up and down pins of the second counter. The most recent count value at the time of overflow is output at the 4 Q output pins of the first counter into the 4 input pins A, B, C, and D of the second counter. A clear (CLR) pin allows each counter to be cleared and reset to zero. A LOAD pin stores the value apparent on pins A, B, C, and D, and the counters output their state to their respective Q-pins. As a non-limiting example, the value stored may be a reference value associated with a reference linear and/or a rotational position of the subject. Each of the count values may be associated with a linear and/or a rotational position of the subject. Applying the four most significant bits (MSBs) of the desired 8-bit value to the first counter and having it load may then pass those values on to the second to be loaded, and the 4 Least Significant Bits (LSBs) can be loaded into the first counter to set the combined 8-bit counter to start counting from any value desired. Alternatively, with slight modifications to the board layout, the four MSBs of the desired 8-bit value may be applied to the second counter, which passes on the 4 LSBs to the first counter.

In another embodiment, one or more standard counters may be used in lieu of dual-clock counters.

Although the embodiment of the cascaded counters configuration is explained with reference to a 4-bit counter IC, this configuration may also be executed with a circuit comprising logic gates including NAND, NOR, NOT, AND and OR, CMOS circuits and/or any other equivalent circuits. Hence, the above description shall not be considered limiting in any manner.

In a preferred embodiment, the optical encoder system may further include an input/output (I/O) expander. The I/O expander may serve as a parallel to serial interface. The serial interface may be an inter-integrated circuit (I²C) protocol interface. Although I²C is preferred, the interface may be any equivalent parallel to serial interface as understood by one of ordinary skill level in the art. As a non-limiting example, the I/O expander may be model no. PCA9671 manufactured by NXP as shown in FIGS. 1B and 2B. The 4 Q outputs of the first and the second counters may be electrically connected to pins P00-P07 of the I/O expander, while pins P11-P17 control the clearing and loading of the counters. In an embodiment, Pin P10 of the I/O expander may be connected to an LED or a buzzer or any similar indicating element for indicating the active counter. In another embodiment, the optical encoder system may include a paperclip-style reset button connected to the RESET pin of the I/O expander to allow for a manual reset. In yet another embodiment, the RESET pin of the I/O expander may simply be electrically connected to the $V_{dd}$ pin of the I/O expander.

The three address pins of the I/O expander (AD0, AD1, and AD2) may each be connected to one of either a power, ground, I²C data, or I²C clock signal via one of three single-pole-four-throw selector switches shown in FIG. 1B. These three switches can provide a controlling processor in communication with the optical encoder system to select and can communicate with one of the encoder systems on the network, assigned one of 64 addresses as defined in the datasheet. This provides the possibility to connect up to 64 of these encoder systems via a single I²C network. Alternatively, I/O expander chips with greater or fewer address capabilities may be used or more such 64 address I/O expanders may be used in combination with one another.

In an embodiment, the optical encoder system may further include a buffer. As a non-limiting example, the buffer may be model no. P82B96 manufactured by TEXAS INSTRUMENTS as shown in FIGS. 1B and 2B. The buffer, connected to SCL and SDA (pins 18 and 20) of the I/O expander, is used to connect these devices together and communicate with the computer positioned a fair distance away using a two-wire (four wires if including power and ground) I²C protocol. As such, the buffer may be configured to adapt the serial signal for long distance transmission. Long distances may include the distance from the location of the sensor to an external computer. An example of this may be the distance from a rudder or propeller shaft on a vessel to the vessel's computer. The buffer may allow an increased voltage to be used, increased maximum allowable bus capacitance for operation and decreased clock frequency below the standard I²C frequency, resulting in a much higher noise tolerance and maximum bus length. As a non-limiting example, the bus speed may be decreased from a standard 400 kHz down to 120 kHz, allowing the bus length to be increased from about 1 m up to 250 m. As this hardware configuration takes care of any high-speed measurements and operations required, the status of each encoder device in the network may be polled at the leisure of the user.

The optical encoder system may further include a connector, such as a wire to board connector. The connector may be electrically connected to the output of the buffer. For example, the connector may be a 4-pin printed circuit board (PCB) receptacle model no. 5025850470 manufactured by MOLEX, or other appropriate PCB receptacle, as shown in FIGS. 1B and 2B. As an example, the connector may be a 1.5 mm pitch version configured for 24 AWG wire. Alternatively, the connector may be a 2.0 mm pitch version configured for 22 AWG wire.

The optical encoder system may further include one or more voltage regulators. The voltage regulators may be model no. AOZ1281 manufactured by ALPHA & OMEGA SEMICONDUCTOR, or other appropriate voltage regulator, as shown in FIG. 2C. A voltage regulator may be, for example, a switching regulator or linear regulator selected for optimal parameters including heat dissipation and line losses/voltage drop based on a particular embodiment. In an example, the voltage regulation scheme includes applying 16 V source voltage on the bus coming into the board through the connector with the buffered I²C clock and data. The 16 V source voltage may power both regulators. One of the regulators may output 12 V to supply the buffer, while the other may output 5 V to supply the other components. The 12 V regulator may be used to ensure that all of the buffers in the network are operating at approximately the same voltage to match logic levels. While the voltage range of the buffer should ensure operability despite any voltage drop that may occur, the 12 V regulator can provide an additional level of protection.

In an additional voltage regulator example configuration, the 12 V regulator may be implemented outside of the optical encoder system. A 5 V switching regulator will be implemented, such as AOZ1281. The switching regulator may output approximately 5.3 to 5.5 V. The output switching regulator may be electrically connected to the input of a linear voltage regulator, such as model no. AP7335A manufactured by DIODES INCORPORATED, or other appropriate voltage regulator, as shown in FIG. 2C. For example, for a switching regulator that outputs a waveform with a minimum of 5.3V and a maximum of 5.5V, the selected linear regulator may be selected to regulate an input as low as 5.3V and as high as 5.5V. The linear voltage regulator is configured to reduce the supply voltage to 5 V to ensure the power supplied to the majority of the components is as clean and accurate as possible while not significantly affecting the efficiency of the switching supply.

Similar voltage regulation may be achieved using other voltage conversion techniques, including buck conversion, boost conversion, buck-boost conversion, low dropout regulation, programmable power management or a combination thereof. Hence, the above mentioned voltage regulation scheme should not be considered as limiting in any manner.

Figure 2A:
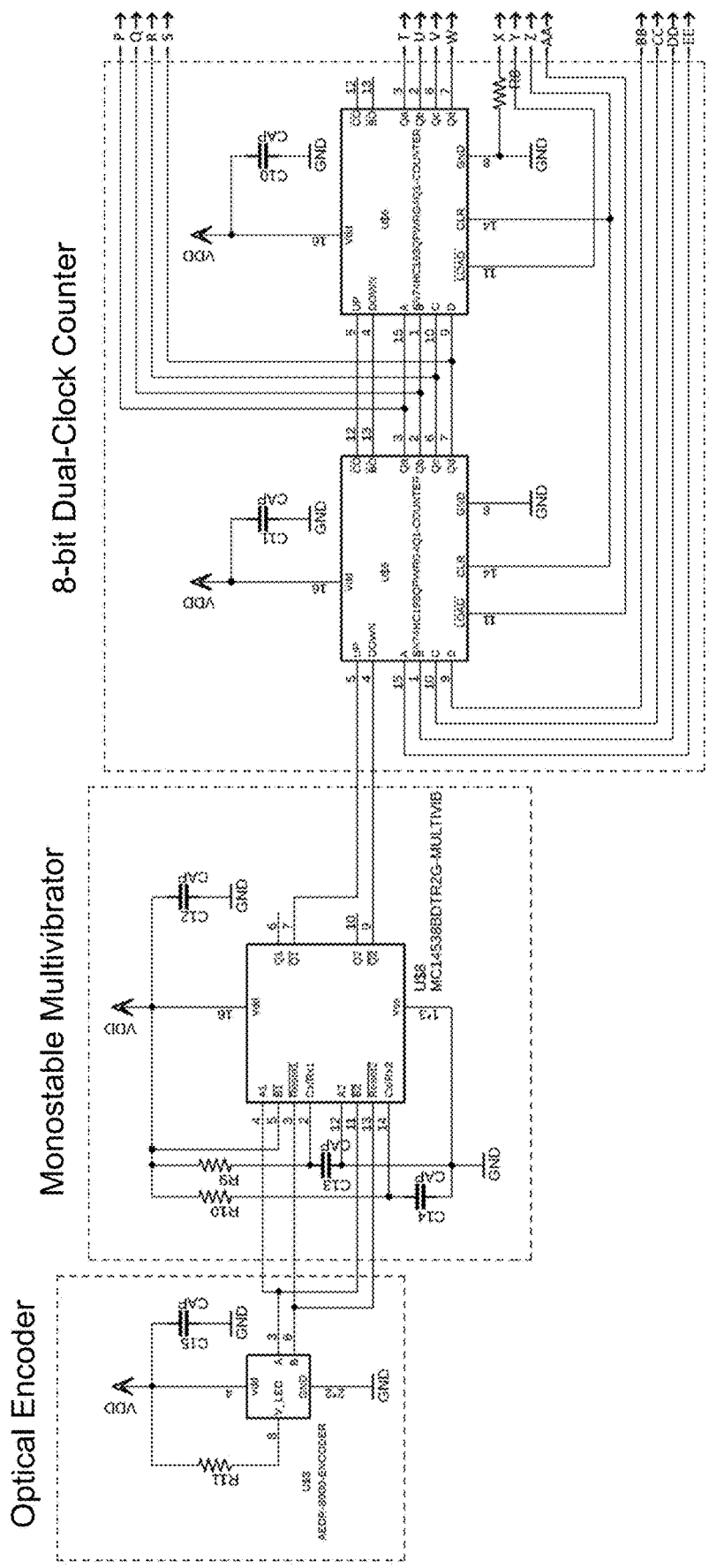
FIG. 2A shows a first portion of a circuit schematic of a second embodiment of the present disclosure.
Figure 2B:
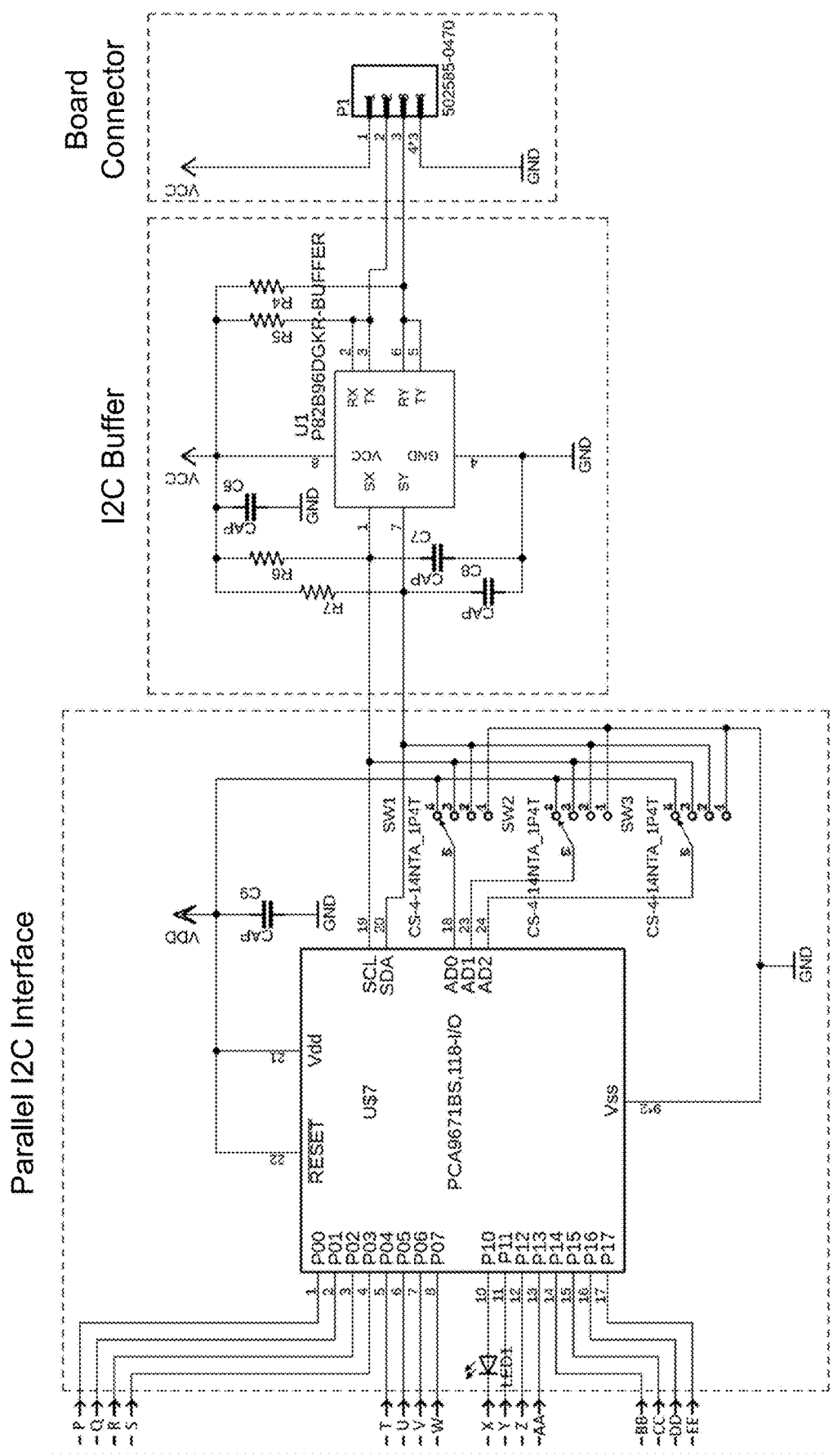
FIG. 2B shows a second portion of a circuit schematic of a second embodiment of the present disclosure.
Figure 2C:
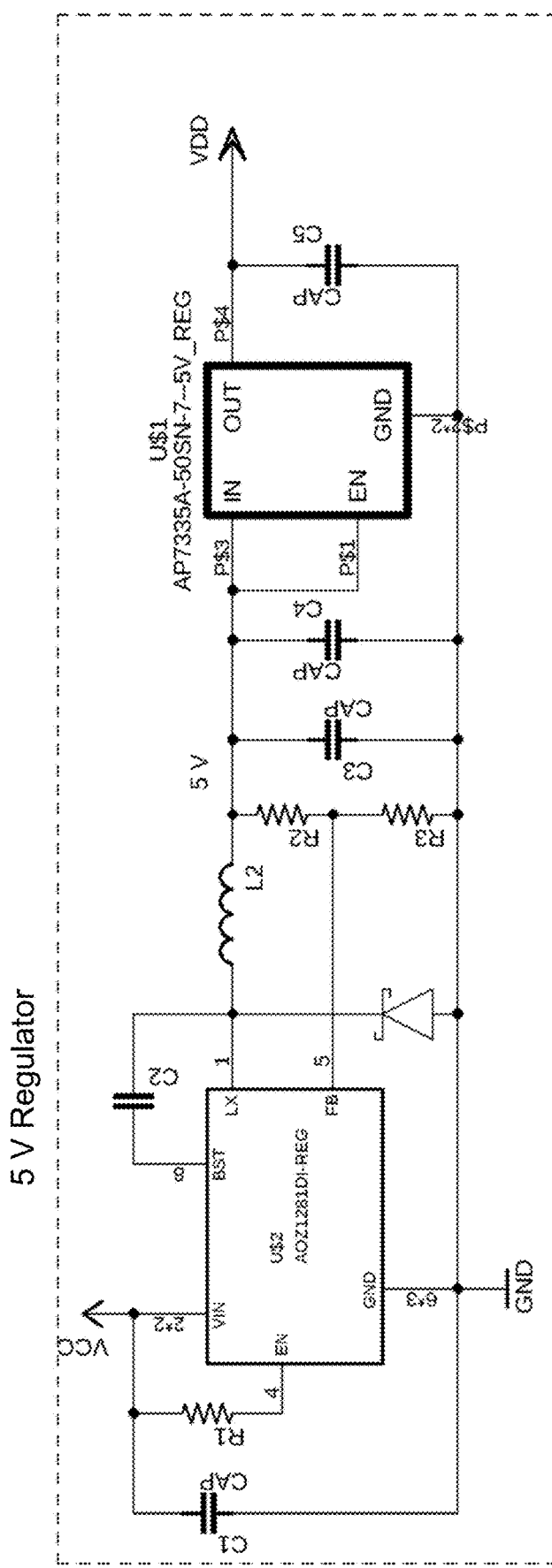
FIG. 2C shows a third portion of a circuit schematic of a second embodiment of the present disclosure.

In an alternate aspect of the first embodiment, the two optical sensors may be replaced with a single reflective surface mount optical encoder such as model no AEDR-8000 manufactured by AVAGO TECHNOLOGIES, as shown in FIG. 2A. As opposed to the two individual optical encoders, the single optical encoder may only need a supply of power and ground. This encoder may output two signals; one for counting up and one for counting down. Further, the two individual optical encoders may require a plurality of components, as well as a pin for calibration. Without the need for calibration connections, each counter can be loaded independently if need be, and an extra bit may be available to be used as desired. As a non-limiting example, a buzzer or other indicator may be included to help determine the active encoder for a given address.

It is possible that either of the discrete sensor configuration or the single encoder configuration may be advantageous depending on the physical design constraints imposed by the problem to be solved. Both configurations are compatible with both codestrips (for linear encoding) and codewheels (for angular encoding). As a non-limiting example, the same device may be used with either a codestrip wrapped around the edge of a control axle (like a tire around a hub) or a codewheel affixed to the face of the axle, depending on a desired application. While encoder ICs are described herein, ICs that offer similar features and configurations may be employed.

In a second embodiment of the present disclosure, the optical encoder system may include a single optical encoder and a monostable multivibrator connected between the outputs of the encoder and the inputs of the counter, as shown in FIGS. 2A-2C. FIGS. 2A-2C represent a single circuit schematic, with breaks P-DD and VDD. For example, the optical encoder may be a reflective surface mount encoder, such as model no. AEDR-8000 manufactured by AVAGO TECHNOLOGIES, as shown in FIG. 2A and as explained above. The two outputs of the encoder, pins 3 and 6 may be fed as control inputs into the monostable multivibrator. The monostable multivibrator may be configured as detailed below in a preferred embodiment. The monostable multivibrator may also be configured in any other configurations including ones based on timer circuits and the likes as well understood by one of ordinary skill level in the art. The remaining aspects of the first embodiment may be carried over to this embodiment.

Figure 3:
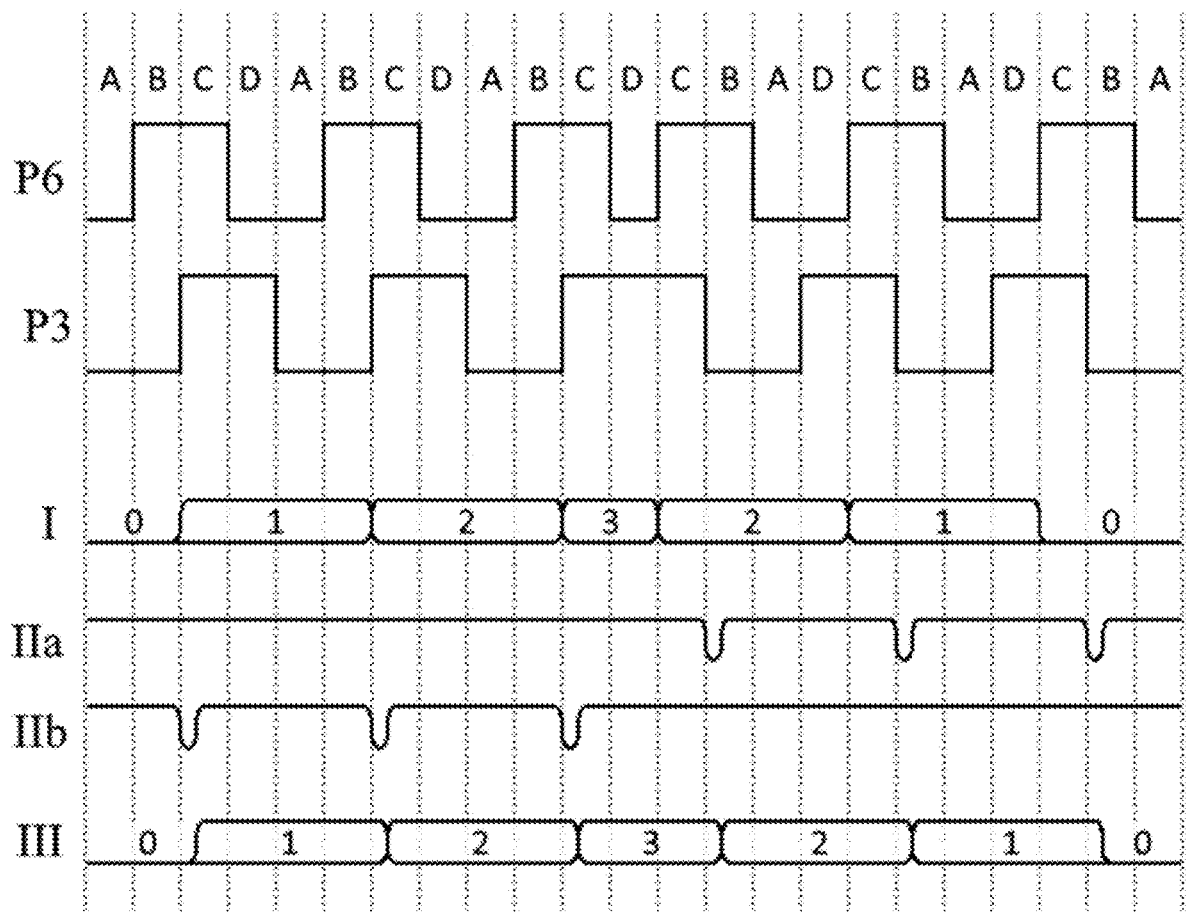
FIG. 3 shows a waveform diagram of a scenario of operation of the second embodiment of the present disclosure.
Figure 4:
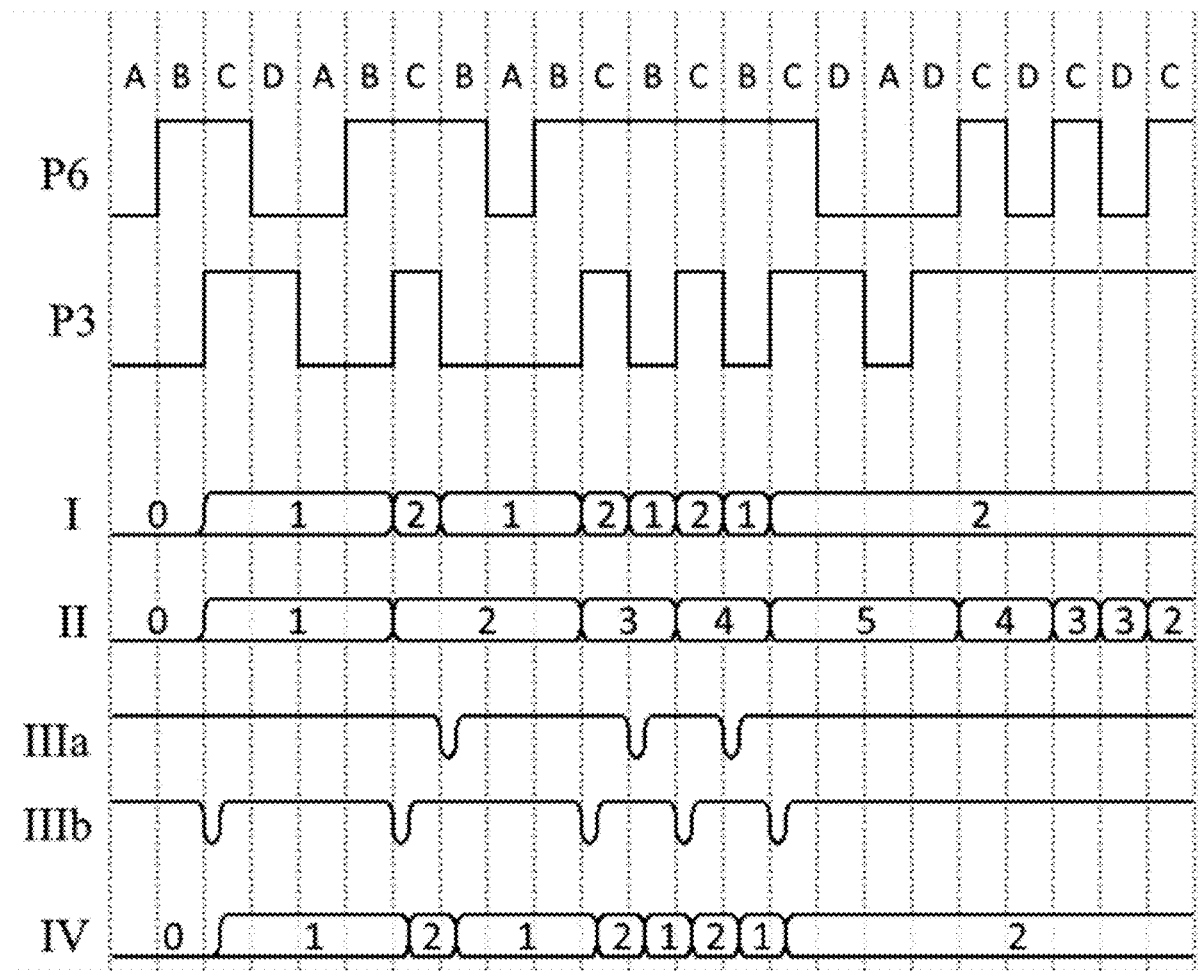
FIG. 4 shows another waveform diagram of a scenario of operation of the second embodiment of the present disclosure.

The monostable multivibrator may be a dual monostable multivibrator, such as model no. MC14538 manufactured by ON SEMICONDUCTOR, as shown in FIG. 2A. In a non-limiting example, the dual monostable multivibrator functions essentially as a pulse generator. The following explanations of FIGS. 3 and 4 are exemplary scenarios disclosed to explain the advantage of including monostable multivibrator and other scenarios are possible. FIG. 3, which depicts a possible, typical operation of the circuit disclosed in FIGS. 2A-2C, shows the two outputs from the optical encoder P6 and P3. A, B, C and D are the 4 states within which the pulses are observed in reference to, according to the gray code value of the position as disclosed earlier. The waveform "I" represents the output of the counter when the outputs 3 and 6 of the encoder are directly connected to the up and down inputs of the 4-bit up down counter disclosed earlier. It can be observed that initially, P6 leads P3 and when the count reverses direction P3 leads P6.

When the output of the encoder is connected to the input of the counter via the monostable multivibrator, the two outputs of the monostable multivibrator are shown by "IIa" and "IIb" and the output of the counter is shown by "III". The output pin 6 of the encoder is connected to the ENABLE/Reset inputs of the two monostable multivibrators in the dual monostable multivibrator IC and the output pin 3 is connected to the inputs of the two monostable multivibrators that controls which outputs are to be pulsed. The monostable multivibrator stays at a High output until an event is detected at the inputs when the enable input is High. While enabled, that is, when pin 6 of the encoder (connected to pins 3 and 13—the "enables"—of the monostable multivibrator) is High, and when a rising edge event occurs at pin 3 of the encoder, output "IIb" is pulsed. Alternatively, when pin 6 of the encoder is High, and when a falling edge event occurs at pin 3 of the encoder (connected to pins 4 and 11—a noninverting input of the first and an inverting input of the second, respectively—of the monostable multivibrator), output "IIa" is pulsed. The monostable multivibrator generates a pulse by momentarily dropping to Low. When it rises back up, that rising edge may cause the counter to either count up or down depending on which input ("IIa" or "IIb") received the pulse. The output "III" shows the reversal of counting direction of the counter, as the pulses change between the above mentioned inputs.

In order to appreciate the advantage of including a monostable multivibrator, the following possible erratic scenario is explained with reference to FIG. 4. FIG. 4 shows a situation where the subject toggles between two positions as can be observed in the B-C-B-C-B-C positions. It is to be noted that, a similar scenario may arise even if the subject does not necessarily toggle. The encoder may observe a position close to transition and oscillate because of system noise. Either way, the desired output of the counter is shown by "I" where the counter executes timely reversal of direction. In practical scenarios, the counter may more likely continue to count in the same direction as shown in waveform "II." The inclusion of the monostable multivibrator can eliminate the error and ensure timely reversal of counting direction as shown in waveform "IV" by operating as explained herein. As seen in FIG. 4, waveforms "IIIa" and "IIIb" are the outputs of the monostable multivibrator, and "IV" is the output of the counter with the monostable multivibrator applied. Furthermore, even if the response time is not quick enough for the erratic behavior near the transition edge, such behavior can be ignored, as the pulse will stay low until the bounce-like waveform stabilizes.

In another aspect of the second embodiment, the two individual optical encoders may be used, instead of the single encoder, in combination with the monostable multivibrator.

Figure 5:
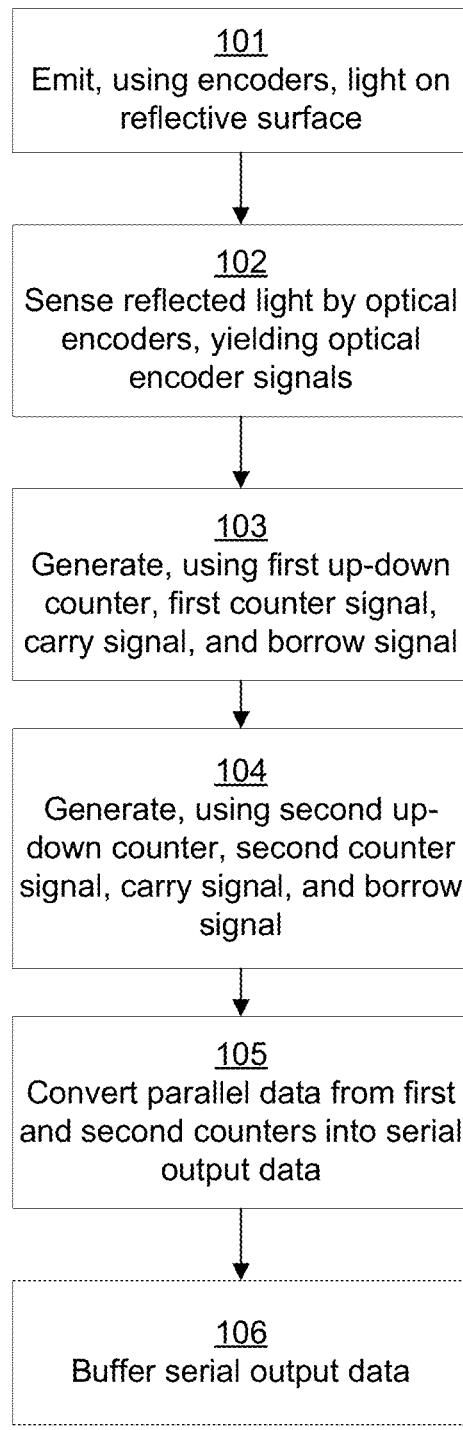
FIG. 5 shows a flowchart of a method according to a third embodiment of the present disclosure.

In a third embodiment of the present disclosure, a method 100 for optical encoding is disclosed with reference to FIG. 5. In step 101, the encoders, according to the first and second embodiments of the present disclosure may emit light on a reflective surface. The reflective surface, as a non-limiting example, may be the aforementioned codewheel and/or codestrip. In step 102, the reflected light may be sensed by the two optical sensors and the first optical sensor signal and the second optical sensor signal may be generated. In step 103, the first up/down counter according to the first and second embodiments of the present disclosure may generate four first counter signals, a carry signal and a borrow signal based on the first sensor output signal and the second sensor output signal from step 102. In step 104, the second up/down counter according to the first and second embodiments of the present disclosure may generate four second counter signals, based on the carry signal and the borrow signal from step 103. In step 105, the parallel to serial interface (e.g., I/O) expander according to the first and second embodiments of the present disclosure converts the parallel data from the first and second counters into a serial output data. The serial output data may include a serial data signal with at least two voltage levels and a serial clock signal with a frequency. The serial output data may be according to I²C protocol or any other serial protocol to similar communication effect. In step 106, the serial output data from step 105 may be buffered with a buffer according to the first and second embodiments of the present disclosure. The buffered signal may have a higher bus capacitance and voltage and a lower frequency. All steps in method 100 can be used in accordance with the systems of the first and second embodiments of the present disclosure.

The steps of the method described in the various embodiments and examples disclosed herein are sufficient to carry out the methods of the present invention. Thus, in an embodiment, the method consists essentially of a combination of the steps of the methods disclosed herein. In another embodiment, the method consists of such steps.

Although the present disclosure has been described with respect to one or more particular embodiments, it will be understood that other embodiments of the present disclosure may be made without departing from the scope of the present disclosure.

What is claimed is:

1. An optical encoder system, comprising:
a reflective surface;
a first optical sensor configured to generate a first output signal;
a second optical sensor configured to generate a second output signal;
a first up-down counter configured to count up or down from a reference value based on the first and second output signals and generate a first counter signal, a borrow output signal, and a carry output signal;
a second up-down counter configured to count up or down relative to the first counter signals based on the borrow output signal and the carry output signal and generate a second counter signal;
a parallel to serial communication interface configured to serialize a parallel signal comprising the first counter signal and the second counter signal into a serial signal; and
a buffer configured to adapt the serial signal for long distance transmission.

2. The system of claim 1 further comprising a monostable multivibrator, operatively connected to the first optical sensor and second optical sensor and the first up-down counter, wherein the monostable multivibrator is configured to modify the first output signal and the second output signal prior to arrival of the first output signal and the second output signal at the first up-down counter.

3. The system of claim 1, wherein the first up-down counter and the second up-down counter are in a cascaded configuration.

4. The system of claim 1, wherein the parallel to serial communication interface comprises an input/output (I/O) expander configured to convert the parallel signal into the serial signal, wherein the serial signal comprises at least two voltage levels and a serial clock signal having a frequency.

5. The system of claim 4, wherein the I/O expander comprises an electronic data storage unit operatively connected to the buffer and configured to store a plurality of values of the serial signal as a plurality of serial output data values.

6. The system of claim 5, wherein the I/O expander further comprises a switchable address pin, the switchable address pin configured to select one of the serial output data values.

7. The system of claim 4, wherein the serial signal comprises an inter-integrated circuit (I²C) protocol signal.

8. The system of claim 4, wherein adapting the serial signal for long distance transmission includes increasing at least one of the voltage levels and decreasing the frequency of the serial clock signal.

9. The system of claim 1, wherein the first and second optical sensors are reflective optical encoders configured to sense light reflecting from the reflective surface.

10. The system of claim 1, wherein the reflective surface comprises a codewheel or a codestrip.

11. The system of claim 1, wherein the first and the second output signals correspond to a linear or rotational position of a driving control unit in an autonomous vehicle.

12. A method for encoding optical data, comprising:
emitting light on a reflective surface;
generating a first output signal at a first optical sensor and a second output signal at a second optical sensor based on a reflected light signal from the reflective surface;
counting up or down from a reference value based on the first output signal and the second output signal, at a first up-down counter, to generate a first counter signal, a borrow output signal, and a carry output signal;
counting up or down from the first counter signal based on the carry output signal and the borrow output signal, at a second up-down counter, to generate a second counter signal;
serializing, at a parallel to serial communication interface, a parallel signal comprising the first counter signal and second counter signal into a serial signal; and buffering, at a buffer, the serial signal thereby adapting the serial signal for long distance transmission.

13. The method of claim 12 further comprises modifying the first output signal and the second output signal, using a monostable multivibrator operatively connected to the first optical sensor, the second optical sensor, and the first up-down counter, prior to arrival of the first output signal and the second output signal at the first up-down counter.

14. The method of claim 12, wherein serializing the parallel signal comprises converting, at an input/output (I/O) expander, the parallel signal into the serial signal, wherein the serial signal comprises at least two voltage levels and a serial clock signal having a frequency.

15. The method of claim 14, further comprising storing a plurality of values of the serial signal as a plurality of serial output data values on an electronic data storage unit of the I/O expander.

16. The method of claim 14, wherein the serializing the parallel signal comprises generating a serial signal comprising an inter-integrated circuit ($I^2C$) signal.

17. The method of claim 14, wherein buffering the serial signal includes increasing at least one of the voltage levels and decreasing the frequency of the serial clock signal.

18. The method of claim 12, wherein the first and the second output signals correspond to a linear or rotational position of a driving control unit in an autonomous vessel.

19. The method of claim 12 further comprising regulating a voltage, using a voltage regulator, to provide a plurality of supply voltages to at least one component.

20. The method of claim 19 wherein the voltage regulator may comprise one or more of a buck regulator, a boost regulator, a buck-boost regulator, or a programmable power management integrated circuit-based regulator.

* * * * *